United States Patent
Ishihara (10) Patent No.: US 8,115,585 B2
(45) Date of Patent: Feb. 14, 2012

(54) VARIABLE RESISTANCE ELEMENT

(75) Inventor: Kazuya Ishihara, Kurashiki (JP)

(73) Assignee: Sharp Kabushiki Kaisha, Osaka (JP)

( * ) Notice: Subject to any disclaimer, the term of this patent is extended or adjusted under 35 U.S.C. 154(b) by 756 days.

(21) Appl. No.: 11/994,646

(22) PCT Filed: Jul. 5, 2006

(86) PCT No.: PCT/JP2006/313389
§ 371 (c)(1),
(2), (4) Date: Nov. 19, 2008

(87) PCT Pub. No.: WO2007/007606
PCT Pub. Date: Jan. 18, 2007

(65) Prior Publication Data
US 2009/0102597 A1   Apr. 23, 2009

(30) Foreign Application Priority Data

Jul. 11, 2005   (JP) ................................ 2005-201118

(51) Int. Cl.
*H01C 7/10*   (2006.01)
(52) U.S. Cl. ........... 338/20; 338/22 R; 338/28; 257/295; 252/500; 423/599
(58) Field of Classification Search ............... 338/22 R, 338/22 SD, 28; 252/62.2, 500, 518.1; 501/123, 501/127, 139; 423/599, 594.1, 600; 257/295
See application file for complete search history.

(56) References Cited

U.S. PATENT DOCUMENTS

| | | | |
|---|---|---|---|
| 6,204,139 B1 | 3/2001 | Liu et al. | |
| 6,766,574 B2 * | 7/2004 | Mizoguchi et al. | 29/611 |
| 6,815,744 B1 * | 11/2004 | Beck et al. | 257/295 |
| 7,045,840 B2 * | 5/2006 | Tamai et al. | 257/295 |
| 7,232,527 B2 * | 6/2007 | Chosokabe et al. | 252/62.3 BT |
| 2005/0009286 A1 | 1/2005 | Hsu et al. | |
| 2005/0145910 A1 | 7/2005 | Tamai et al. | |

FOREIGN PATENT DOCUMENTS

| | | |
|---|---|---|
| JP | 2002-537627 | 11/2002 |
| JP | 2005-167064 | 6/2005 |

OTHER PUBLICATIONS

International Search Report for PCT/JP2006/313389 mailed Aug. 29, 2006.

(Continued)

*Primary Examiner* — Kyung Lee
(74) *Attorney, Agent, or Firm* — Nixon & Vanderhye P.C.

(57) ABSTRACT

In a variable resistance element having a variable resistor between first and second electrodes and changing its electric resistance when a voltage pulse is applied between both electrodes, data holding characteristics can be improved by increasing a programming voltage and programming in a high current density. Therefore, a booster circuit for supplying a high voltage is needed when the variable resistance element is applied to a nonvolatile memory. When the smaller of the areas of the contact regions between the first electrode and variable resistor and between the second electrode and variable resistor is set to the electrode area of the variable resistance element, it is set within a specific range not larger than the predetermined electrode area. Thereby the programming current density can be increased without raising the programming voltage, and the variable resistance element having preferable data holding characteristics even at a high temperature can be provided.

6 Claims, 12 Drawing Sheets

OTHER PUBLICATIONS

Liu et al, "Electric-Pulse-Induced Reversible Resistance Change Effect in Magnetoresistive Films", Applied Physics Letters, vol. 76, No. 19, May 8, 2000, pp. 2749-2751.

Beck et al, "Reproducible Switching Effect in Thin Oxide Films for Memory Applications", Applied Physics Letters, vol. 77, No. 1, Jul. 3, 2000, pp. 139-141.

* cited by examiner

VARIABLE RESISTANCE ELEMENT

CROSS-REFERENCE TO RELATED APPLICATIONS

This application is a National Phase filing under 35 U.S.C. §371 of International Application No. PCT/JP2006/313389, filed on Jul. 5, 2006, and which claims priority to Japanese Patent Application No. 2005-201118, filed on Jul. 11, 2005, the entire contents of these applications are hereby incorporated by reference in their entirety.

TECHNICAL FIELD

The present invention relates to a variable resistance element having a variable resistor between a first electrode and a second electrode and changing its electric resistance when a voltage pulse is applied between both electrodes.

BACKGROUND ART

Recently, as a next-generation NVRAM (Nonvolatile Random Access Memory) capable of operating at high speed to replace a flash memory, various kinds of device structures such as a FeRAM (Ferroelectric RAM), an MRAM (Magnetic RAM), an OUM (Ovonic Unified Memory) are proposed and fierce development race is carried on to implement high performance, high reliability, low cost, and process consistency. However, current each above memory device has good and bad points and it is far from an ideal "universal memory" having good points of an SRAM, a DRAM and a flash memory.

Based on the existing technique, a method of changing an electric resistance reversibly by applying a voltage pulse to a perovskite material known for its colossal magnetoresistance effect is disclosed in the following patent document 1 and non-patent document 1 by Shangquing Liu and Alex Ignatiev et al. in U.S. Houston University. This is an extremely epoch-making method in which while the perovskite material known for its colossal magnetoresistance effect is used, a resistance change over several digits can be provided at room temperature without applying a magnetic field. An RRAM (Resistance Random Access Memory) including a variable resistance element using this phenomenon has superior characteristics such that a power consumption is extremely low because a magnetic field is not needed at all unlike the MRAM, miniaturization and high integration can be easily implemented, and a multilevel storage can be implemented because a dynamic range of the resistance change is considerably larger than the MRAM.

Figure 1:
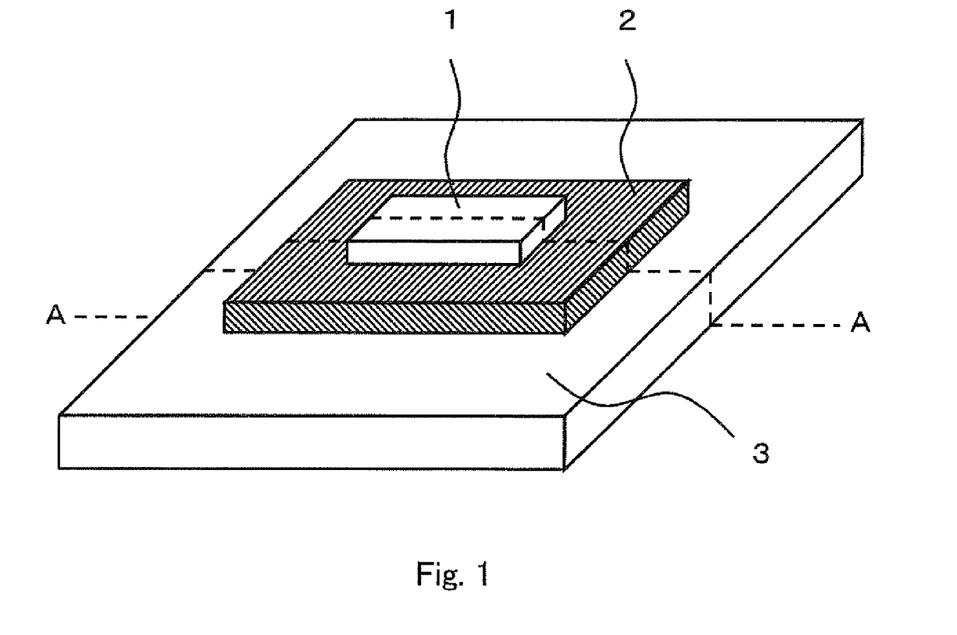
FIG. 1 is a perspective view showing a basic structure of a variable resistance element.
Figure 2:
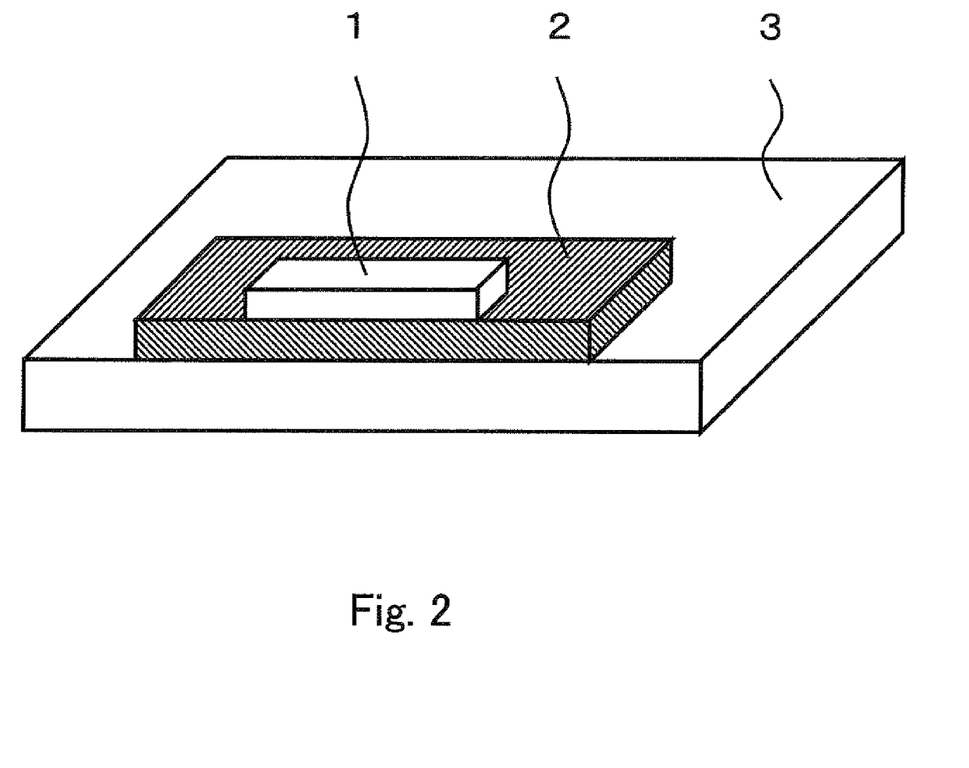
FIG. 2 is a sectional perspective view showing the variable resistance element shown in FIG. 1.

As shown in FIGS. 1 and 2, the basic structure of the actual variable resistance element is extremely simple such that a lower electrode 3 serving as a second electrode, a variable resistor 2 and an upper electrode 1 serving as a first electrode are sequentially laminated. Here, FIG. 1 is a perspective view showing a basic structure of the variable resistance element, and FIG. 2 is a sectional perspective view taken along a line A-A in FIG. 1. In addition, according to an element structure exemplified in the patent document 1, a lower electrode 3 composed of a yttrium barium copper oxide $YBa_2Cu_3O_7$ (YBCO) film is deposited on a single-crystal substrate (not shown) of lanthanum aluminum oxide $LaAlO_3$ (LAO), and a variable resistor 2 sandwiched by the lower electrode 3 and an upper electrode 1 is a crystalline praseodymium calcium manganese oxide $Pr_{1-x}Ca_xMnO_3$ (PCMO) film which is a perovskite-type oxide and the upper electrode 1 is composed of an Ag film deposited by sputtering. As an operation of the variable resistance element, it is reported that the resistance can be reversibly changed by applying positive and negative voltage pulses of 51V between the upper electrode 1 and the lower electrode 3. It is said that a new nonvolatile memory device can be implemented by reading a resistance value in the reversible resistance changing operation (hereinafter referred to as the "switching operation" occasionally).

In addition, a ZnSe-Ge hetero structure or a metal oxide such as Ti, Nb, Hf, Zr, Ta, Ni, V, Zn, Sn, In, Th or Al is known as the material of the variable resistor 2 other than the perovskite material whose resistance value can be changed according to application condition of a voltage pulse although it is small.

Patent document 1: U.S. Pat. No. 6,204,139
Non-patent document 1: Liu, S.Q. et al., "Electric-pulse-induced reversible Resistance change effect in magnetoresistive films", Applied Physics Letter, Vol. 76, pp. 2749-2751, 2000

DISCLOSURE OF THE INVENTION

Problems to be Solved by the Invention

In order to find out the characteristics of a variable resistor whose resistance changes by a voltage pulse, the inventors of the present invention have carried on various kinds of studies using a PCMO film that is a perovskite type metal oxide as the variable resistor material, and found a phenomenon that although the resistance is changed by the voltage pulse, after the variable resistor material is kept for a long period of time at a high temperature, its resistance value fluctuates, which is a major obstacle in applying the variable resistor to a nonvolatile memory device. A description will be made of this phenomenon in a variable resistance element having a structure in which one side length of a nearly square-shaped upper electrode serving as a first electrode is 0.7 μm, and an area of the upper electrode is about 0.5 μm$^2$, with reference to FIGS. 3 to 5 hereinafter.

Figure 3:
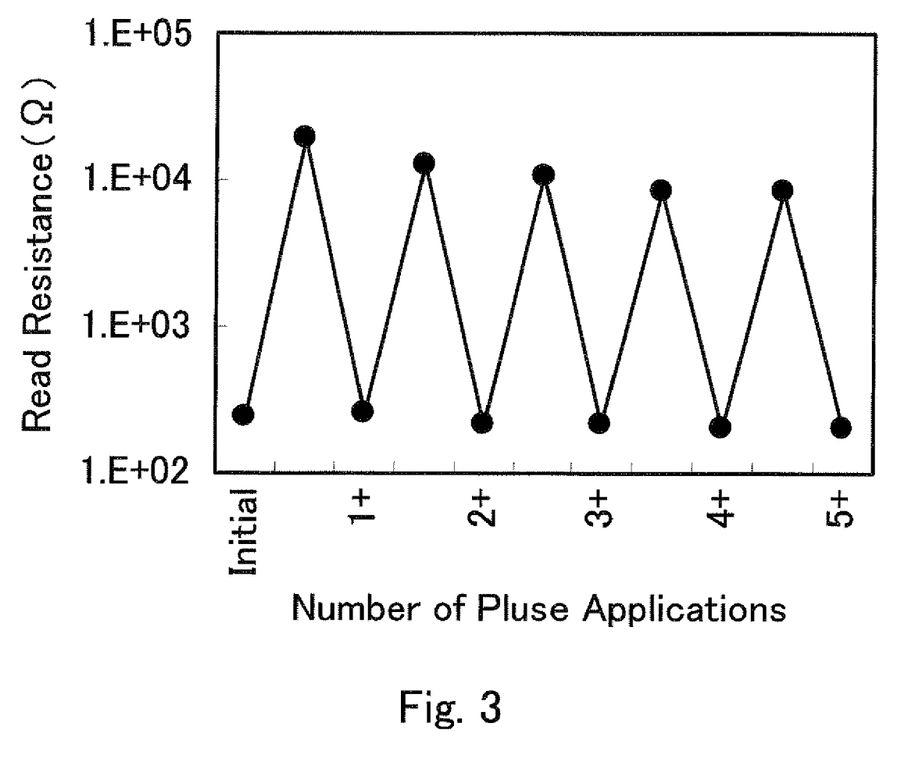
FIG. 3 is a graph showing application of both positive and negative voltage pulses to the variable resistance element and a resistance change.

FIG. 3 is a view showing a change in resistance value when a positive (+2 V) and a negative (−2 V) voltage pulses having a pulse width of 100 nsec are alternately applied to the variable resistance element. The horizontal axis designates the number of pulse applications and the vertical axis designates read resistance in logarithmic scale. As for the number of pulse applications, applying the negative voltage pulse and the positive voltage pulse alternately is counted as one time. As shown in FIG. 3, the resistance value can be changed to a high resistance state (about $1 \times 10^4 \Omega$) by applying the negative (−2 V) voltage pulse, and the resistance value can be changed to a low resistance state (about $2 \times 10^2 \Omega$) by subsequently applying the positive (+2 V) voltage pulse. In addition, it can be changed to the high resistance state by subsequently applying the negative voltage pulse and can be changed to the low resistance state by applying the positive voltage pulse. In addition, each resistance state is maintained until the next voltage pulse is applied although it is not shown. This shows that the variable resistance element can perform the switching operation reversibly between binary data (high resistance state and low resistance state) as a nonvolatile memory element.

Figure 4:
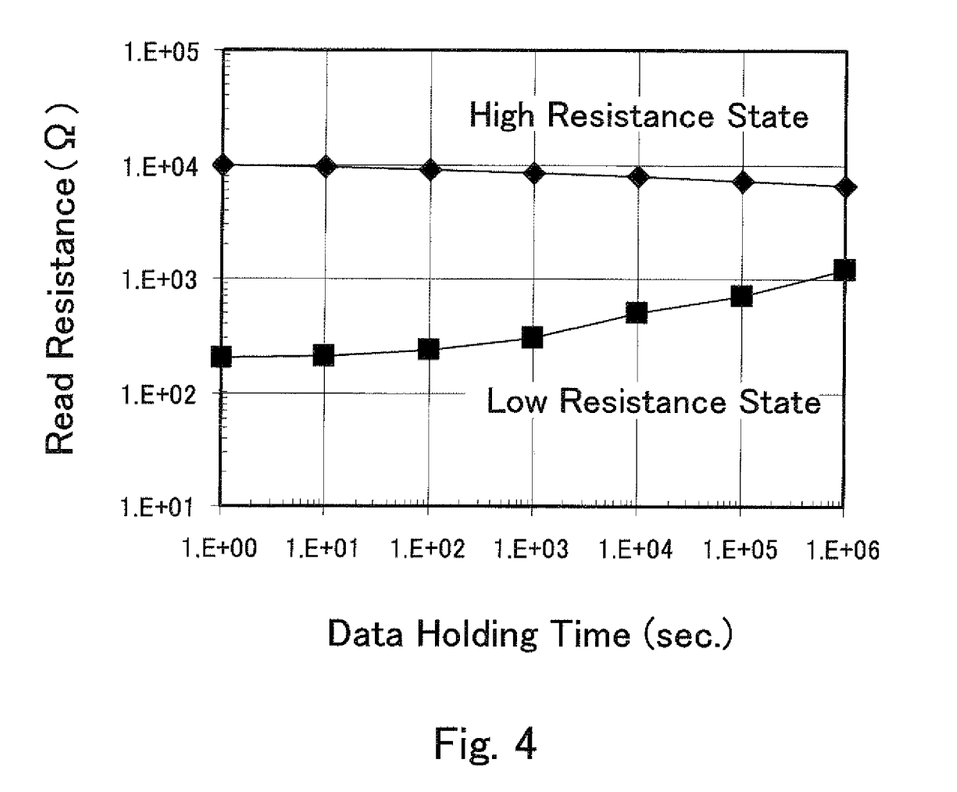
FIG. 4 is a graph showing data holding characteristics of a conventional variable resistance element.

Next, the variable resistance element in which data was programmed in the high resistance state (the resistance value was changed to the high resistance state) by applying the negative voltage pulse (−2 V, 100 nsec), and the variable resistance element in which data was programmed in the low resistance state (the resistance value was changed to the low resistance state) by applying the positive voltage pulse (+2 V, 100 nsec) at room temperature are held at high temperature (120° C.) respectively and then their resistances were read accordingly. The result is shown in FIG. 4. The vertical axis designates a read resistance in logarithmic scale and the horizontal axis designates a holding time in logarithmic scale. As shown in the drawing, it has been confirmed that as the holding time elapses, the resistance value is increased in the low resistance state and the resistance value is decreased in the high resistance state. When the variable resistance element is applied to a resistive nonvolatile memory, such fluctuation of the resistance value causes a read margin to be decreased, which is a serious problem in holding data for a long period of time.

As a breakthrough for this problem, it has been found that stable data holding can be implemented by a data programming method as will be described below through keen examinations by the inventors of the present invention.

Figure 5:
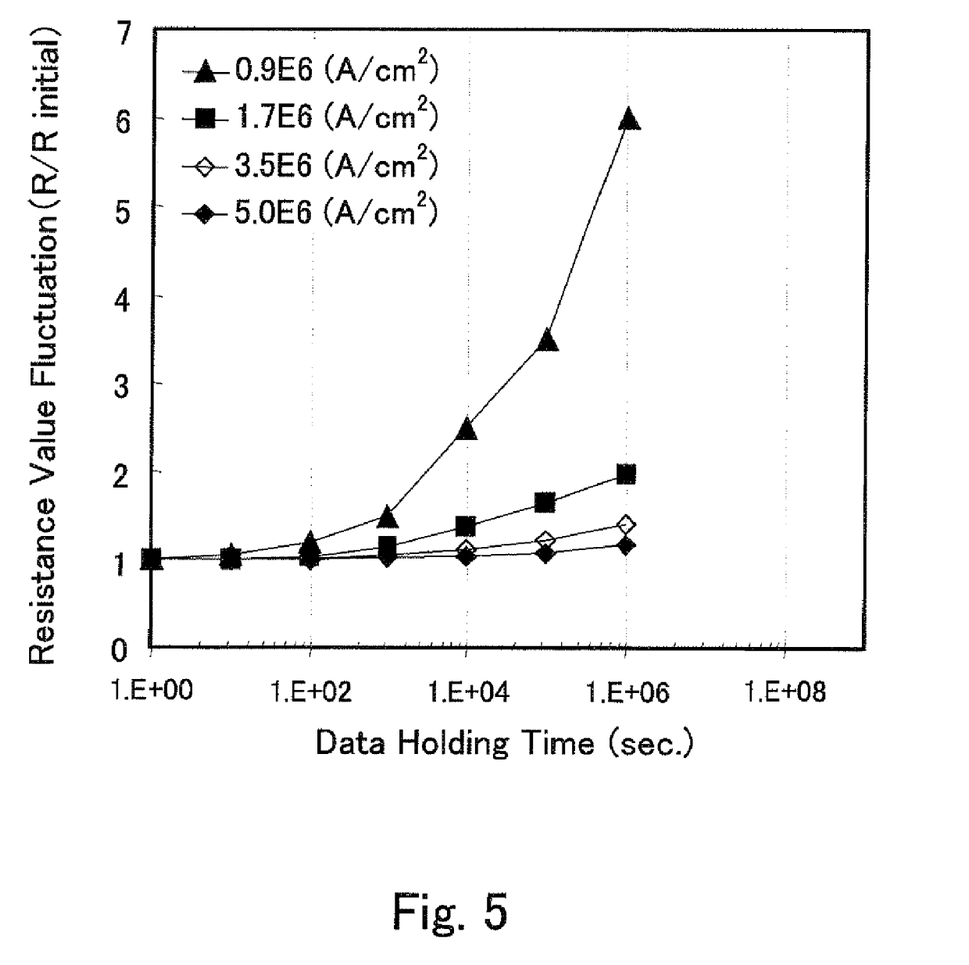
FIG. 5 is a graph showing data holding characteristics of the conventional variable resistance element in a high resistance state using a programming current density as a parameter.

FIG. 5 shows a result of resistance of the variable resistance element programmed by optimizing the voltage pulses so that currents having densities of $0.9 \times 10^6$ A/cm$^2$, $1.7 \times 10^6$ A/cm$^2$, $3.5 \times 10^6$ A/cm$^2$, and $5.0 \times 10^6$ A/cm$^2$ may flow in the variable resistance element when data in the low resistance state is programmed in the variable resistance element and held at 120° C. and then read accordingly. The vertical axis designates the resistance value fluctuation and the horizontal axis designates the data holding time in logarithmic scale. The resistance value fluctuation in the vertical axis shows a fluctuation rate from the resistance value just after programmed in the low resistance state for the first time. As the current density flowing in the variable resistance element at the time of programming is increased, the resistance value fluctuation is suppressed. As a result, the inventors have found that the holding characteristics are improved by programming at a higher current density at the time of programming.

Although the current density at the time of programming is proportional to the programming voltage and proportional to the length (layer thickness) of the resistor, it is constant regardless of the sectional area of the resistor. Therefore, when the layer thickness of the resistor is not changed, in order to increase the current density at the time of programming, the programming voltage of the variable resistance element is to be raised.

However, when the variable resistance element is applied to the resistive nonvolatile memory, in order to raise the programming voltage to be more than the power supply voltage, it is necessary to provide peripheral circuits including a booster circuit represented by a charge pump to supply a high voltage. According to the method using the charge pump, although a higher voltage than an original voltage can be implemented by a multistage booster (booster circuits are connected in series), the problem is that the area of the peripheral circuit is increased accordingly. Especially, according to the method using the general charge pump, when the voltage is raised three times as high as the original voltage or more, the boosting efficiency is lowered and the boosted voltage is saturated. In addition, since a transistor circuit including the booster circuit needs a withstand voltage corresponding to the final boosted voltage, the problem is that there is a limit to the boosted voltage.

Thus, the present invention was made in view of the above problems and it is an object of the present invention to provide a variable resistance element capable of programming in a high current density at a programming voltage similar to the conventional voltage without raising the voltage applied at the time of programming, and superior in data holding characteristics even at a high temperature.

Means for Solving the Problem

A variable resistance element according to the present invention to attain the above object comprises a variable resistor between a first electrode and a second electrode in which electric resistance between the first electrode and the second electrode is changed by applying a voltage pulse between the first electrode and the second electrode, and it is characterized in that at least one of an area of a contact region between the first electrode and the variable resistor and an area of a contact region between the second electrode and the variable resistor is not larger than a critical area defined by a boundary value between an electrode area region having a constant current density and an electrode area region having a variable current density, of a current flowing in the variable resistance element with respect to a variation in electrode area of the variable resistance element.

In addition, the variable resistance element according to the present invention is characterized in that the variable resistor includes an oxide having a perovskite structure containing at least one element selected from Pr, Ca, La, Sr, Gd, Nd, Bi, Ba, Y, Ce, Pb, Sm, and Dy, and at least one element selected from Ta, Ti, Cu, Mn, Cr, Co, Fe, Ni, and Ga.

In addition, the variable resistance element according to the present invention is characterized in that the variable resistor includes an oxide having a perovskite structure represented by any one of the following general formulas ($0 \leq x \leq 1, 0 \leq z < 1$): $Pr_{1-x}Ca_x[Mn_{1-z}M_z]O_3$ (M is any element selected from Ta, Ti, Cu, Cr, Co, Fe, Ni and Ga); $La_{1-z}AE_xMnO_3$ (AE is any divalent alkaline earth metal selected from Ca, Sr, Pb and Ba); $RE_{1-x}Sr_xMnO_3$ (RE is any trivalent rare earth element selected from Sm, La, Pr, Nd, Gd and Dy); $La_{1-x}Co_x[Mn_{1-z}Co_z]O_3$; $Gd_{1-x}Ca_xMnO_3$; and $Nd_{1-x}Gd_xMnO_3$.

In addition, the variable resistance element according to the present invention is characterized in that the variable resistor is a PCMO film having a perovskite structure, and the electrode area of the variable resistance element is not larger than 0.04 μm$^2$.

In addition, the variable resistance element according to the present invention is characterized in that the variable resistor is a ZnSe-Ge hetero structure or a metal oxide comprising at least one element selected from T, Nb, Hf, Zr, Ta, Ni, V, Zn, Sn, In, Th and Al.

Furthermore, the variable resistance element according to the present invention is characterized in that each of the first electrode and the second electrode contains at least one of noble metal of platinum group metals, single metal selected from Ag Al, Cu, Ni, Ti and Ta or their alloy, an oxide conductor selected from Ir, Ru, Re and Os, and an oxide conductor selected from SRO ($SrRuO_3$), LSCO ($(LaSr)CoO_3$) and YBCO ($YbBa_2Cu_3O_7$).

EFFECT OF THE INVENTION

According to the variable resistance element of the present invention having the variable resistor between the first electrode and the second electrode and changing in electric resistance by the voltage pulse applied between both first and second electrodes, when the smaller area of the area of the contact region between the first electrode and the variable resistor and the area of the contact region between the second electrode and the variable resistor is set to the electrode area of the variable resistance element, since the electrode area of the variable resistance element is set within a specific range that is not larger than the predetermined electrode area, the programming current density can be increased without raising the programming voltage. Thus, the variable resistance element having preferable data holding characteristics even at a high temperature can be provided.

EXPLANATION OF REFERENCES 1, 4 First electrode
2, 7 Variable resistor
3, 6 Second electrode
5 Silicon oxide film
8, 10 Opening
9 Sidewall spacer film

BEST MODE FOR CARRYING OUT THE INVENTION

An embodiment of a variable resistance element according to the present invention will be described with reference to the drawings hereinafter.

While the inventors of the present invention have carried on various studies, they have found a phenomenon different from general characteristics observed in a conductor, in the relation between an electrode area and a current density of a variable resistance, which leads to the present invention and will be described in detail hereinafter.

The inventors of the present invention manufactured variable resistance elements having various electrode areas and studied about their electric characteristics. In this specification, the term "electrode area of the variable resistance element" means an area of an electrically contributing region in a variable resistor and it is defined as a smaller area of an area of a contact region between a first electrode and the variable resistor and an area of a contact region between a second electrode and the variable resistor. Here, the reason why the smaller area is employed is that the smaller area is the electrically contributing region in the variable resistor dominantly.

Figure 6:
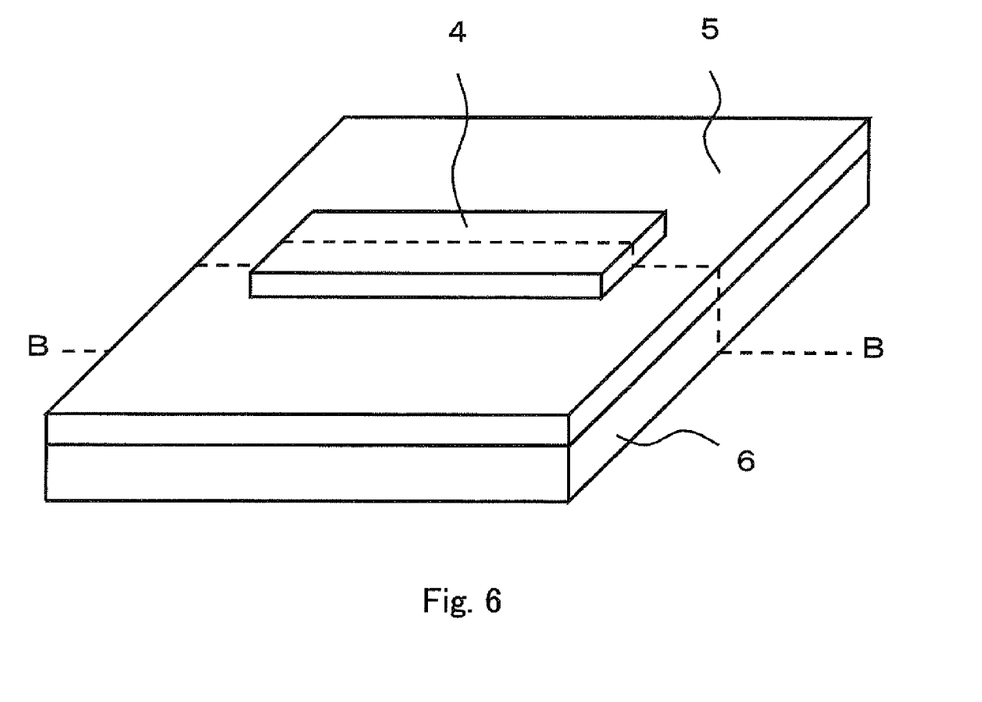
FIG. 6 is a perspective view showing a structure of a variable resistance element to explain an embodiment of the present invention.

First, a structure of the variable resistance element used in this embodiment will be described. According to this embodiment, the variable resistance elements having various electrode areas ranging from about 0.004 $\mu m^2$ to 5 $\mu m^2$ were manufactured with a PCMO film that is an oxide having a perovskite-type structure as one example of the variable resistor. FIG. 6 is a perspective view showing a structure of a variable resistance element used in this embodiment. As shown in FIG. 6, a lower electrode 6 serving as a second electrode, a silicon oxide film 5 serving as an insulation material, and an upper electrode 4 serving as a first electrode are laminated in this order. Here, FIG. 7 is a sectional perspective view taken along a line B-B in FIG. 6.

Figure 7:
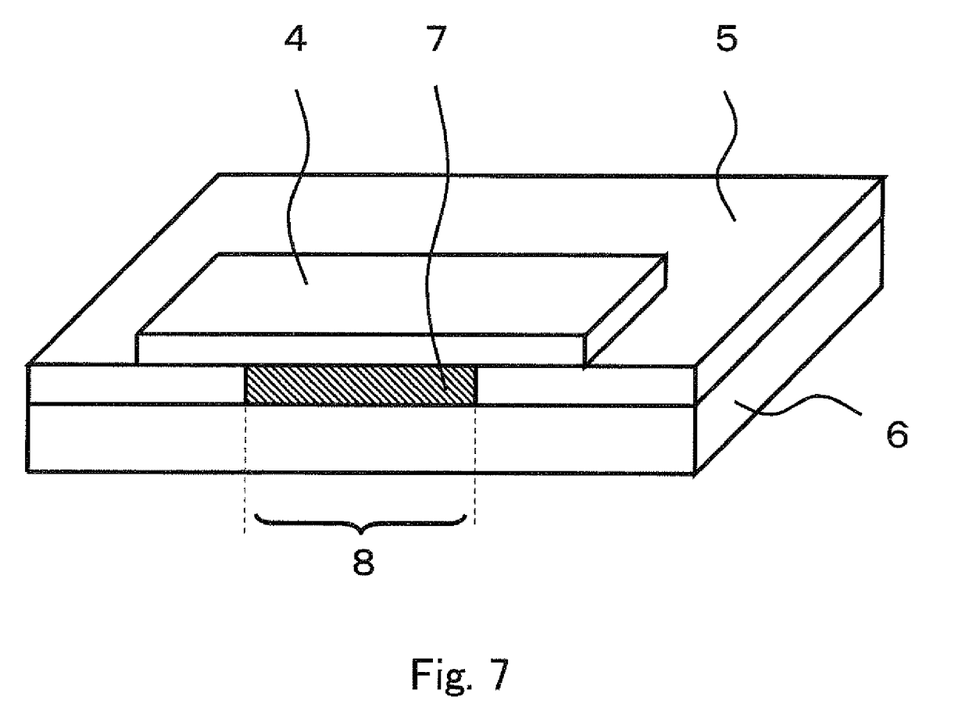
FIG. 7 is a sectional perspective view of a variable resistance element as one example used in the present embodiment.

As shown in FIG. 7, the lower electrode 6 serving as the second electrode, the silicon oxide film 5 serving as the insulation material, and the upper electrode 4 serving as the first electrode are laminated in this order, and especially a variable resistor 7 is formed so as to be buried in the silicon oxide film 5 in a region sandwiched between the upper electrode 4 and the lower electrode 6. Variable resistance elements having this structure and electrode areas ranging from 5 $\mu m^2$ to 0.12 $\mu m^2$ were manufactured by a method as will be described below. The one having an electrode area of 0.12 $\mu m^2$ or smaller was manufactured as follows.

Figure 8:
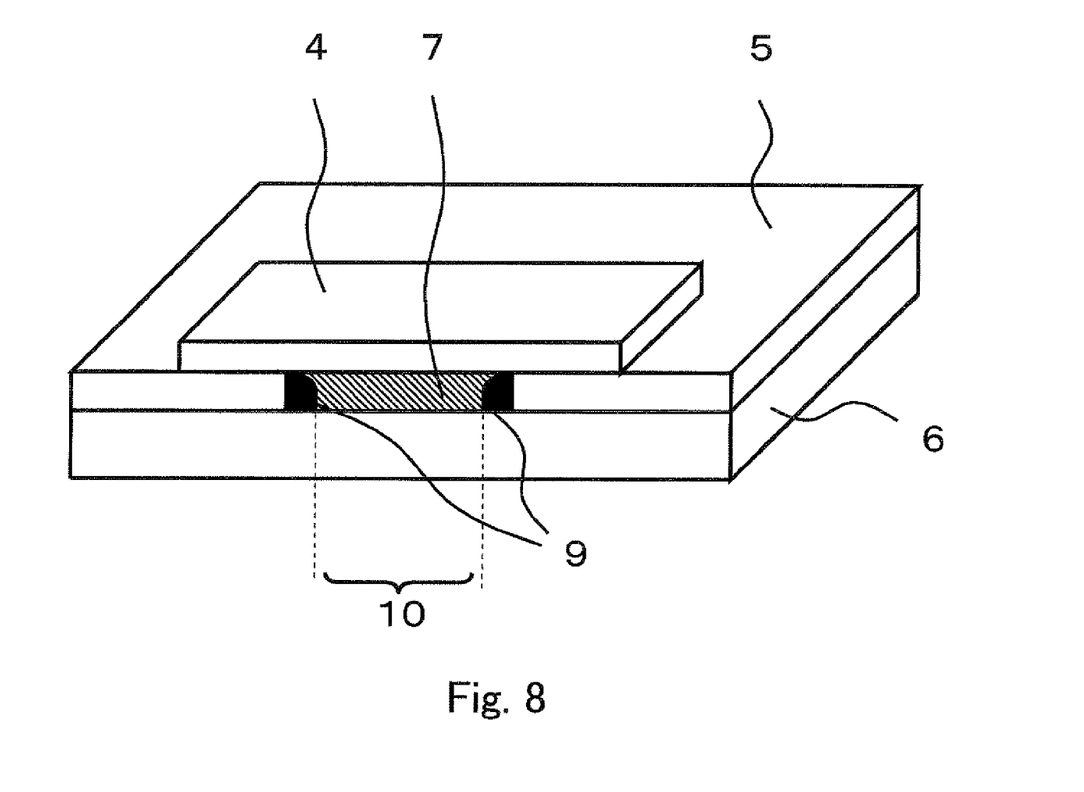
FIG. 8 is a sectional perspective view showing a variable resistance element as another example used in the present embodiment.

Although the variable resistance element having an electrode area of 0.12 $\mu m^2$ can be manufactured in an approximately square-shaped opening 8 having one side length of minimum processing dimension (0.35 $\mu m$) according to a design rule of 0.35 $\mu m$, when the dimension is smaller than the above value, it is necessary to change a process parameter. In order to minimize the effect of the difference in process on the electric characteristics, a variable resistance element was manufactured having an electrode area of 0.12 $\mu m^2$ or smaller by providing a sidewall after forming the opening having the minimum processing dimension (0.35 $\mu m$). FIG. 8 is a sectional perspective view showing a second structure of the variable resistance element. As shown in FIG. 8, a lower electrode 6 serving as a second electrode, a silicon oxide film 5 serving as an insulation material, and an upper electrode 4 serving as a first electrode are laminated in this order, and a sidewall spacer film 9 is formed in an approximately square-shaped opening having the minimum processing dimension (0.35 $\mu m$) formed in the silicon oxide film 5, and a variable resistor 7 is buried in it.

As shown in FIG. 8, when the wall spacer film 9 is formed in the opening, an opening 10 can be formed in the minimum processing dimension or less. In this structure, variable resistance elements having electrode areas (second electrode side) of 0.12 $\mu m^2$ to 0.004 $\mu m^2$ can be manufactured.

The variable resistance element having such structure was manufactured by the following processes. In order to manufacture the variable resistance element having the structure shown in FIG. 7, a Pt film is formed as one example of the lower electrode 6 on a base substrate (not shown) by sputtering. Then, the silicon oxide film 5 having a film thickness of 100 nm is deposited by the CVD (chemical vapor deposition) method. Then, the opening 8 is formed in the silicon oxide film 5 so as to reach the lower electrode 6 and a PCMO film as the variable resistor 7 having a relative proportion of $Pr_{1-X}Ca_XMnO_3$ (X=0.3), for example at a temperature of 500° C. is deposited so as to be 200 nm in thickness by sputtering. Then, the PCMO film is polished by a CMP (Chemical Mechanical Polishing) method so as to remain only in the opening 8. Then, a Pt film as one example of the upper electrode 4 is formed by sputtering so as to be larger than the size of the opening 8.

Next, FIG. 8 shows the structure in which the sidewall spacer film 9 is formed on the sidewall of the opening 8 by the well-known technique. Similar to the structure shown in FIG. 7, the Pt film as one example of the lower electrode 6 and the silicon oxide film 5 are deposited, and the opening 8 was formed. Then, a silicon nitride film serving as the insulation material is deposited by the CVD method and anisotropically etched back so that the silicon nitride film remains only on the sidewall of the opening 8, whereby the sidewall spacer film 9 can be formed. The sidewall spacer film 9 is provided in order to reduce the area of the opening 8 so as to be smaller than the minimum processing dimension defined by the design rule of the manufacturing process, so that the size of the reduced opening 10 can be adjusted by changing the film thickness of the sidewall spacer film 9 at the time of deposition. In addition, the electrode area of the variable resistor 7 shown in FIG. 8 corresponds to the area of an opened region of the reduced opening 10 to the lower electrode.

According to this embodiment, the Pt film having a thickness of 100 nm was used as one example of the lower electrode 6 and the upper electrode 4, and the PCMO film having a relative proportion of $Pr_{1-X}Ca_XMnO_3$ (X=0.3) was used as one example of the variable resistor 7. Although the PCMO film was deposited so as to be 200 nm in thickness at deposition temperature of 500° C. at the time of a depositing process, the film thickness after polished so as to remain only in the opening 8 or opening 10 was approximately equal to the thickness of the silicon oxide film 5, about 100 nm in this embodiment.

Figure 9:
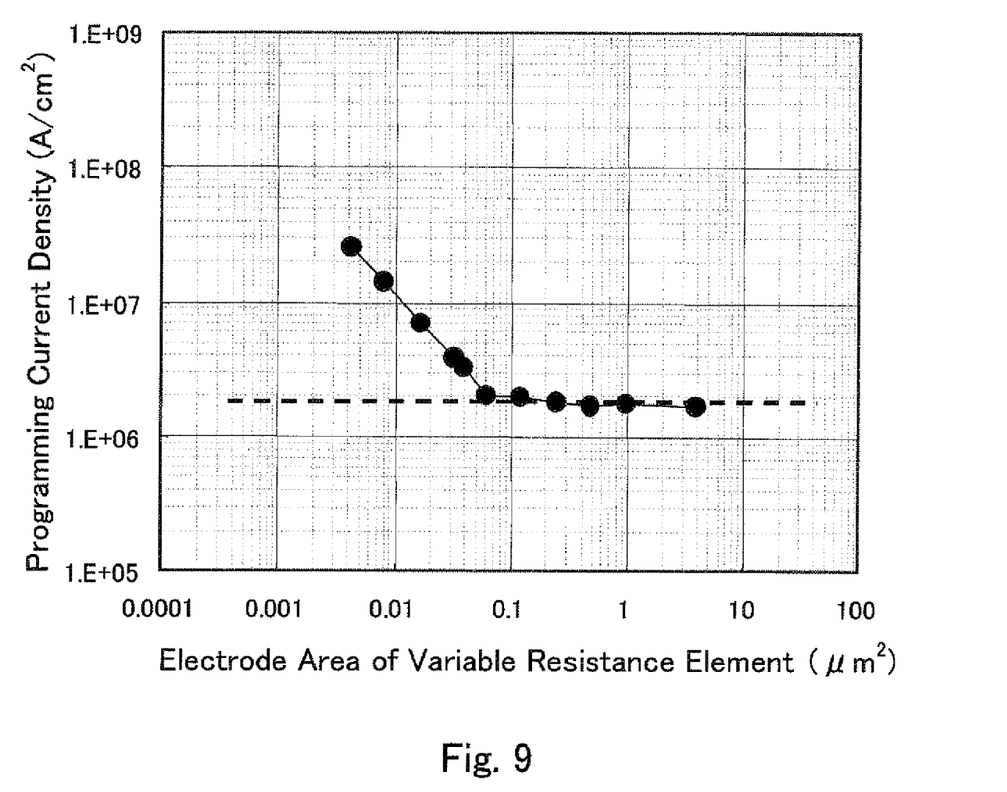
FIG. 9 is a graph showing a relation between an electrode area and a programming current density of the variable resistance element.

Then, the electric characteristics of the various kinds of variable resistance elements having electrode areas ranging from 0.004 $\mu m^2$ to 5 $\mu m^2$ were measured. A programming voltage pulse is applied to the variable resistance element and a current density at that time was measured. FIG. 9 shows a relation between the electrode area and a programming current density of the variable resistance element when a programming voltage pulse having a constant value (+2 V) is applied to the variable resistance element. The vertical axis designates the programming current density in logarithmic scale and the horizontal axis designates the electrode area of the variable resistance element in logarithmic scale. Here, the programming current density is a current density per unit area of a current flowing in the variable resistance element at the time of programming. As shown in FIG. 9, while the programming current density is almost constant in the case where the electrode area of the variable resistance element (PCMO film) is about 0.06 $\mu m^2$ or larger regardless of the area, the programming current density is abruptly increased as the electrode area of the variable resistance element (PCMO film) is reduced in the case where the electrode area is 0.04 $\mu m^2$ or smaller. Such a phenomenon is not seen in a normal resistor. This phenomenon is different from a general resistor (that is, a conductor) in which its resistance is not changed by application of the voltage pulse. More specifically, according to the general resistor, as shown in a dotted line in FIG. 9, the current density is constant when the electrode area is larger than 0.0001 $\mu m^2$ and the current density is lowered by a quantum wire effect when the electrode area becomes 0.0001 $\mu m^2$ or smaller.

As described above, the variable resistance element used in the present invention shows a phenomenon that it has the constant current density area region in which the programming current density is kept at a constant value regardless of the area, and the variable current density area region in which the programming current density abruptly rises as the area is reduced and when the intersection between the constant current density area region and the variable current density area region is defined as a critical area, it shows the same phenomenon as the normal resistor (conductor) when the area is larger than the critical area and it shows the phenomenon specific to the variable resistance element when the area is not larger than the critical area.

Therefore, it has been found that when the electrode area of the variable resistance element is not larger than the critical area, programming can be performed in the variable resistance element at a larger programming current without raising the programming voltage. In addition, when the PCMO film is used as the variable resistance element, it is preferable that the electrode area is not larger than the predetermined area of 0.04 $\mu m^2$ and not smaller than 0.004 $\mu m^2$ in which the characteristics were confirmed.

Then, data holding characteristics of the various kinds of variable resistance elements having the electrode area of 0.004 $\mu m^2$ to 5 $\mu m^2$ were measured. The variable resistance element became low resistance state after application of programming voltage pulse of +2 V and kept at 120° C. and its resistance value was read at a reading voltage of 0.6 V. In addition, the reason why the reading voltage is set to 0.6 V is that the resistance value of the variable resistance element is hardly changed before and after the reading voltage application when such low voltage is applied.

Figure 10:
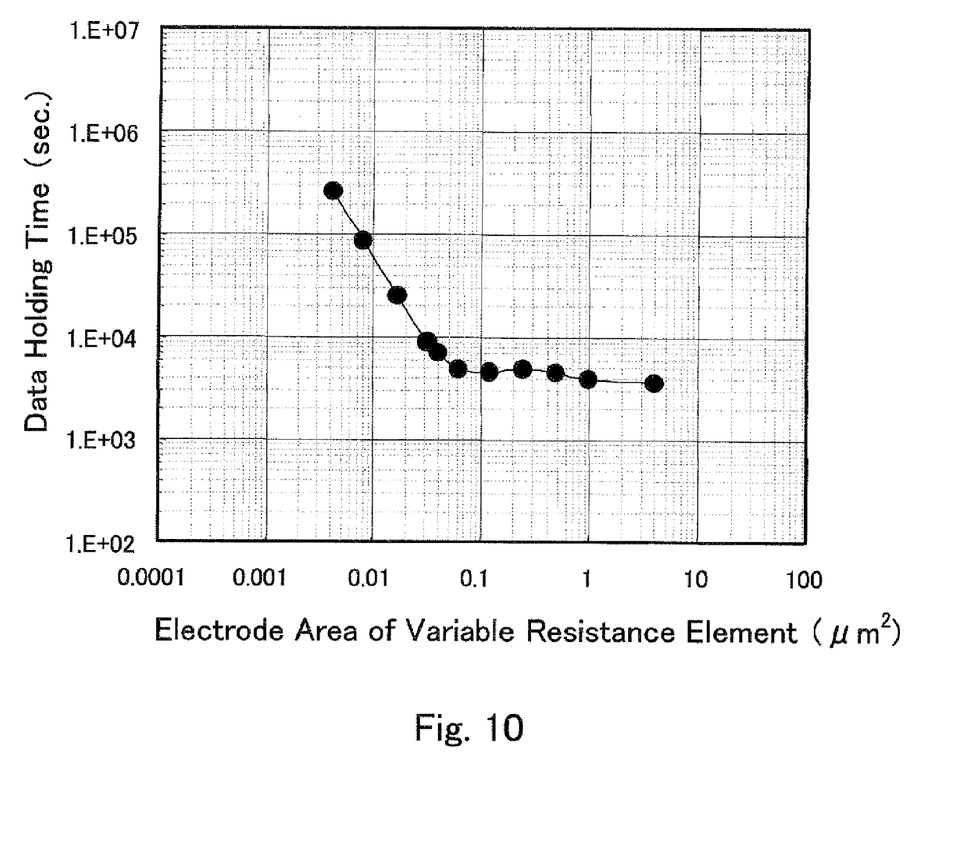
FIG. 10 is a graph showing a relation between the electrode area and a data holding time of the variable resistance element.

FIG. 10 shows a relation between the electrode area and a data holding time of the variable resistance element. The vertical axis designates the data holding time in logarithmic scale and the horizontal axis designates the electrode area of the variable resistance element in logarithmic scale. Here, a time until a resistance value is changed 10 percent (increased or decreased) from an initial resistance just after data programming (low resistance state) is defined as the data holding time for convenience. It has been confirmed that the data holding characteristics of the electrode area of the variable resistance element are improved when the electrode area is 0.04 $\mu m^2$ approximately.

As can be clear from the above description, when the electrode area of the variable resistance element, that is, the smaller area of the area in which the first electrode and the variable resistor are in contact with each other and the area in which the second electrode and the variable resistor are in contact with each other is set to be equal to or smaller than the critical area, the data holding characteristics can be improved when data is programmed at a larger programming current without raising the programming voltage. For example, when the PCMO film is used, the electrode area of the variable resistance element may be equal to or smaller than the critical area of 0.04 $\mu m^2$.

In addition, when the variable resistance element is applied to a nonvolatile memory device, when an electrode area of the variable resistance element is approximately 0.02 $\mu m^2$ or smaller, a programming current density can be three times or more. Therefore, in the case of the resistor element in which programming can be performed at a power supply voltage or less, as long as the electrode area of the variable resistance element is approximately 0.02 $\mu m^2$ or smaller, even when the holding characteristics need to be improved by increasing the programming current density by three times or more, it is not necessary to provide a multistage booster circuit and the like, so that a peripheral circuit can be small and the design can be simple as a memory device.

In addition, although the description has been made of the variable resistance element having the structure in which the opening is formed in the silicon oxide film and the variable resistor is buried in the opening as shown in FIGS. 6 to 8, to implement the electrode area of the variable resistance element having the minimum processing dimension or less in the above embodiment, the present invention is not limited to this. For example, the present invention may be applied to a structure in which an upper electrode is laminated on a variable resistor as shown in FIGS. 1 and 2. In this case, an electrode area of a variable resistance element corresponds to the area of a first electrode.

In addition, although $Pr_{1-X}Ca_XMnO_3$ (X=0.3) has been used in the above embodiment, the same phenomenon is found in perovskite-type oxide designated by "$ABO_3$" in chemical formula represented by lead titanate ($PbTiO_3$) or barium titanate ($BaTiO_3$) as the variable resistor 7. For example, in a case of a Pr, Mn perovskite-type oxide also, "A" is partially or totally replaced with Pr and "B" is partially or totally replaced with Mn in the above chemical formula "$ABO_3$" to be simply $Pr_XA_{1-X}MnO_3$ ($0 \leq X \leq 1$), or to be $(Pr_XA_{1-X})(Mn_YB_{1-Y})O_3$ ($0 \leq X \leq 1, 0 \leq Y < 1$) by increasing the number of atoms to be replaced with "A" or "B". "A" may be at least one element selected from Ca, La, Sr, Gd, Nd, Bi and Ce, and "B" may be at least one element selected from Ta, Ti, Cu, Cr, Co, Fe, Ni, and Ga.

As the oxide having the perovskite-type structure serving as the variable resistor 7, (Pr, Ca) $MnO_3$, $SrTiO_3$, (Ba, Sr) $TiO_3$, $LaMnO_3$, $LaTiO_3$, (Nd, Sr) $MnO_3$, (La, Sr) $MnO_3$ are representatively preferable.

Although the above material provides a phenomenon in which the electric resistance is changed by voltage pulse application, the $Pr_{1-X}Ca_XMnO_3$ material (PCMO film) shows a larger resistance value change by the voltage pulse among them, and the composition when X=0.3 approximately is preferable as the variable resistor 7 in the present invention.

In addition, although the electric resistance change is smaller than that of the perovskite structure, the same phenomenon is found when ZnSe—Ge hetero structure or metal oxide such as Ti, Nb, Hf, Zr, Ta, Ni, V, Zn, Sn, In, Th, or Al is used as the variable resistor 7.

A description will be made of an example when titanium oxide is used as the variable resistance element. The variable resistance element of titanium oxide has a structure in which a sidewall spacer film is formed in the opening shown FIG. 8. A titanium nitride having a thickness of 150 nm was used for the lower electrode serving as the second electrode, titanium oxide having a thickness of 6 nm formed by the well-known reactive sputtering method was used for the variable resistance element and a titanium nitride TiN film having a thickness of 150 nm was used for the upper electrode serving as the first electrode. In this structure, a variable resistance element having an electrode area (second electrode side) of 0.0014 to 0.08 $\mu m^2$ was manufactured.

Figure 11:
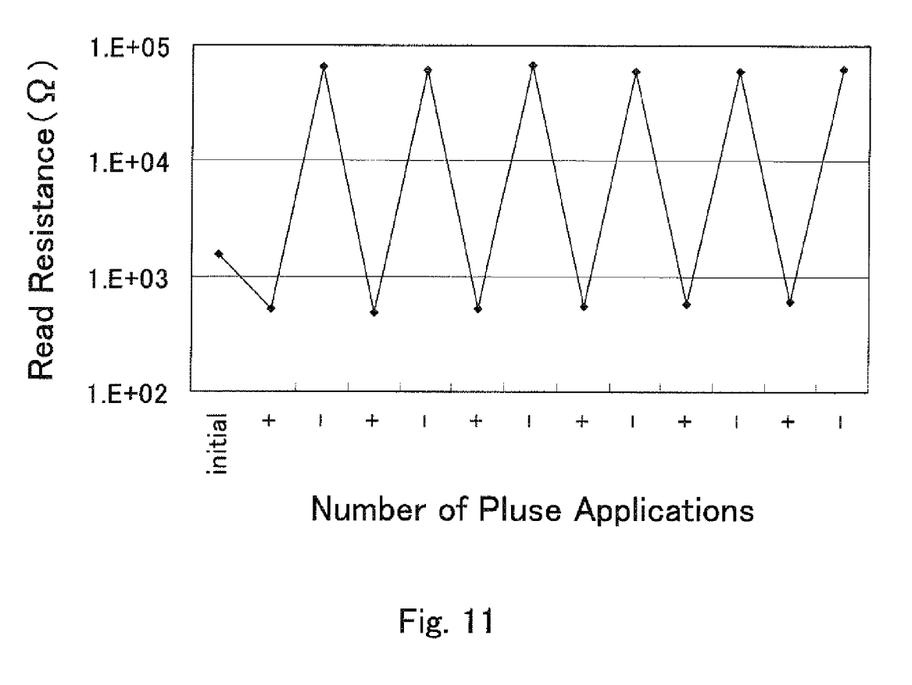
FIG. 11 is a graph showing application of both positive and negative voltage pulses to a titanium oxide variable resistance element and a resistance change.

FIG. 11 shows one example of the resistance change of the titanium oxide having an electrode area of 0.01 $\mu m^2$. As a pulse application condition, a positive +2.2V, a pulse width of 50 nsec, a negative 1.8V, and a pulse width of 35 nsec are used. As shown in FIG. 11, the resistance is changed to a high resistance state (about $6 \times 10^5 \Omega$) by the positive voltage pulse and changed to a low resistance state (about $5 \times 10^2 \Omega$) by the negative voltage pulse.

Figure 12:
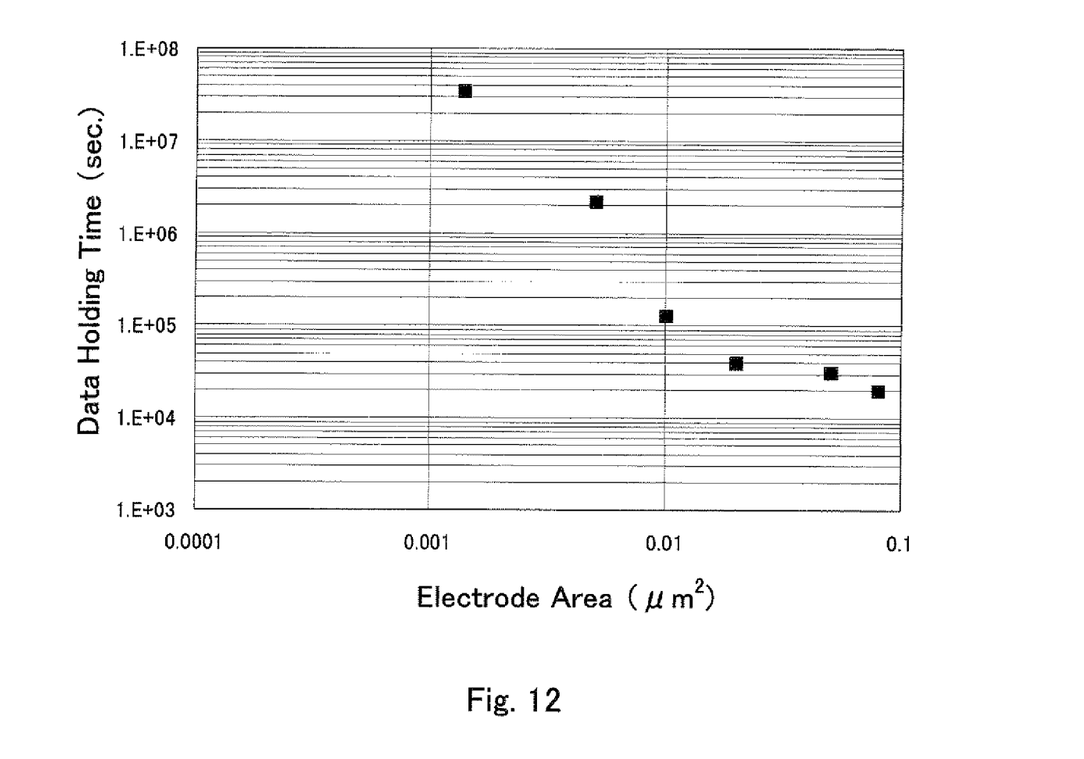
FIG. 12 is a graph showing a relation between an electrode area and a data holding time of a titanium oxide variable resistance element.

Then, the data holding characteristics of the titanium oxides having electrode areas of 0.0014 $\mu m^2$ to 0.08 $\mu m^2$ are measured. Similar to the above, after programming in the high resistance state and low resistance state at room temperature, the variable resistance element was held at 120° C. and the resistance is read accordingly. FIG. 12 shows the relation between a data holding time defined like the above PCMO and the electrode area. It has been confirmed that the data holding characteristics are improved at an electrode area of 0.01 $\mu m^2$ approximately.

More specifically, the variable resistor whose electric resistance is changed by electric pulse application provides the same result shown in the example in which PCMO is used, and its data holding time is drastically improved as the area is reduced from the critical area.

In addition, as the lower electrode 6 serving as the second electrode and the upper electrode 4 serving as the first electrode, single noble metal of platinum group metals represented by Pt, Ir, Rh, or Pd or an alloy based on noble metal, and single metal such as Ag, Al, Cu, Ni, Ti, or Ta or their alloy, and an oxide conductor such as Ir, Ru, Re, or Os, and an oxide conductor such as SRO ($SrRuO_3$), LSCO (($LaSr$) $CoO_3$) or YBCO($YbBa_2Cu_3O_7$) are preferably used.

In addition, when the perovskite-type oxide is used as the variable resistor, an adhesive layer or a barrier layer may be inserted appropriately between the lower electrode 6 and the base substrate to improve adhesiveness or prevent a reaction. For example, when the lower electrode 3 is formed on the BPSG film or silicon oxide film, it is effective to insert Ti, $TiO_X$, $Al_XO_Y$ and the like. In addition, when the electric connection between the substrate and the lower electrode is to be ensured by using a silicon substrate, since conspicuous alloying or oxidation reaction is caused between Pt and Si or between Pt and tungsten plug, it is effective to insert Ti, TiN, $Ti_{1-X}Al_XN$, TaN, SiN or TaSiN between the lower electrode 6 and the Si substrate or between the lower electrode and the tungsten plug.

As described above, when the above variable resistance element is applied to the nonvolatile memory device, since it is not necessary to provide a booster circuit to supply a high programming voltage, a chip area can be small. Thus, the present invention can be applied to a mobile electron device requiring a small chip size as well as the nonvolatile memory device can hold data stably.

The invention claimed is:

1. A variable resistance element comprising a variable resistor between a first electrode and a second electrode, in which electric resistance between the first electrode and the second electrode is changed by applying a voltage pulse between the first electrode and the second electrode, wherein a contact area, defined by at least one of an area of a contact region between the first electrode and the variable resistor and an area of a contact region between the second electrode and the variable resistor is set to be not larger than a critical area defined by an area at a boundary between a constant current density region and a variable current density area region, in the constant current density area region, a programming current density of the variable resistance element is kept constant until the contact area becomes less than the critical area, and in the variable current density area region, the programming current density of the variable resistance element rises as the contact area reduces.

2. The variable resistance element according to claim 1, wherein
the variable resistor is an oxide having a perovskite structure containing at least one element selected from Pr, Ca, La, Sr, Gd, Nd, Bi, Ba, Y, Ce, Pb, Sm, and Dy, and at least one element selected from Ta, Ti, Cu, Mn, Cr, Co, Fe, Ni, and Ga.

3. The variable resistance element according to claim 1, wherein
the variable resistor is an oxide having a perovskite structure represented by any one of the following general formulas ($0 \leqq X \leqq 1$, $0 \leqq Z < 1$):
$Pr_{i-x}Ca_x[Mn_{1-z}M_z]O_3$ (where M is any element selected from Ta, Ti, Cu, Cr, Co, Fe, Ni and Ga);
$La_{i-x}AE_xMnO_3$ (where AE is any divalent alkaline earth metal selected from Ca, Sr, Pb and Ba);
$RE_{1-x}Sr_xMnO_3$ (where RE is any trivalent rare earth element selected from Sm, La, Pr, Nd, Gd and Dy);
$La_{i-x}Co_x[Mn_{i-z}Co_z]O_3$;
$Gd_{1-x}Ca_xMnO_3$; and
$Nd_{i-x}Gd_xMnO_3$.

4. The variable resistance element according to claim 1, wherein
the variable resistor is a PCMO film having a perovskite structure, and the contact area is not larger than 0.04 $\mu m^2$.

5. The variable resistance element according to claim 1, wherein
the variable resistor is a ZnSe—Ge hetero structure or a metal oxide comprising at least one element selected from Ti, Nb, Hf, Zr, Ta, Ni, V, Zn, Sn, In, Th and Al.

6. The variable resistance element according to claim 1, wherein
each of the first electrode and the second electrode contains at least one of noble metal of platinum group metals, single metal selected from Ag Al, Cu, Ni, Ti and Ta or their alloy, an oxide conductor selected from Ir, Ru, Re and Os, and an oxide conductor selected from SRO ($SrRuO_3$), LSCO (($LaSr)C_oO_3$) and YBCO ($YbBa_2Cu_3O_7$).

* * * * *